United States Patent [19]

Ohtani et al.

[11] Patent Number: 5,654,203
[45] Date of Patent: Aug. 5, 1997

[54] METHOD FOR MANUFACTURING A THIN FILM TRANSISTOR USING CATALYST ELEMENTS TO PROMOTE CRYSTALLIZATION

[75] Inventors: Hisashi Ohtani; Hiroki Adachi; Akiharu Miyanaga; Toru Takayama, all of Kanagawa, Japan

[73] Assignee: Semiconductor Energy Laboratory, Co., Ltd., Kanagawa, Japan

[21] Appl. No.: 479,212

[22] Filed: Jun. 7, 1995

Related U.S. Application Data

[63] Continuation-in-part of Ser. No. 347,247, Nov. 23, 1994.

[30] Foreign Application Priority Data

Dec. 2, 1993 [JP] Japan ................................. 5-339399

[51] Int. Cl.$^6$ ........................................ H01L 21/84
[52] U.S. Cl. ..................... 438/97; 427/126.5; 438/166; 438/162; 438/486
[58] Field of Search ............... 437/21, 41, 101, 437/230, 2, 4; 427/304, 305, 123, 125, 126.5, 553–554, 557

[56] References Cited

U.S. PATENT DOCUMENTS

| | | |
|---|---|---|
| 3,856,565 | 12/1974 | Arnold . |
| 5,075,259 | 12/1991 | Moran ................................. 437/230 |
| 5,147,826 | 9/1992 | Liu et al. . |
| 5,275,851 | 1/1994 | Fonash et al. . |
| 5,403,772 | 4/1995 | Zhang et al. ......................... 437/101 |
| 5,488,000 | 1/1996 | Zhang et al. ......................... 437/21 |

OTHER PUBLICATIONS

"Crystallized Si Films By Low–Temperature Rapid Thermal Annealing of Amorphous Silicon", R. Kakkad, J. Smith, W.S. Lau, S.J. Fonash, J. Appl. Phys. 65 (5), Mar. 1, 1989, 1989 American Institute of Physics, pp. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62 (20), May 17, 1993, 1993 American Institute of Physics, pp. 2554–2556.

"Selective Area Crystallization of Amorphous Silicon Films by Low–Temperature Rapid Thermal Annealing", Gang Liu and S.J. Fonash. Appl. Phys. Lett. 55 (7), Aug. 14, 1989, 1989 American Institute of Physics, pp. 660–662.

"Low Temperature Selective Crystallization of Amorphous Silicon", R. Kakkad, G. Liu, S.J. Fonash, Journal of Non–Crystalline Solids, vol. 115, (1989), pp. 66–68, month unknown.

C. Hayzelden et al., "In Situ Transmission Electron Microscopy Studies of Silicide–Mediated Crystallization of Amorphous Silicon", 1991, month unknown.

A.V. Dvurechenskii et al., "Transport Phenomena in Amorphous Silicon Doped by Ion Implantation of 3d Metals", *Akademikian Lavrentey Prospekt* 13, 630090 Novosibirsk 90, USSR, pp. 635–640, 1990, month unknown.

T. Hempel et al., "Needle–Like Crystallization of Ni Doped Amorphous Silicon Thin Films", *Solid State Communications*, vol. 85, No. 11, pp. 921–924, 1993, month unknown.

*Primary Examiner*—John Niebling
*Assistant Examiner*—Richard A. Booth
*Attorney, Agent, or Firm*—Sixbey, Friedman, Leedom & Ferguson; Gerald J. Ferguson, Jr.; Jeffrey L. Costellia

[57] ABSTRACT

In a method for crystallizing an amorphous silicon film by a heat treatment that is effected for a duration of about 4 hours at about 550° C. using a catalyst element for accelerating the crystallization, the quantity of the catalyst element to be introduced into the amorphous silicon is precisely controlled. A resist mask 21 is formed on the surface of an amorphous silicon film 12 provided on a glass substrate 11, and an aqueous solution 14, e.g., an acetate solution, containing a catalyst element such as nickel at a concentration controlled in a range of from 10 to 200 ppm (need to be adjusted) is supplied dropwise thereto. After maintaining the state for a predetermined duration of time, the entire substrate is subjected to spin drying using a spinner 15. A thin film of crystalline silicon is finally obtained by applying heat treatment at 550° C. for a duration of 4 hours.

16 Claims, 2 Drawing Sheets

5,654,203

METHOD FOR MANUFACTURING A THIN FILM TRANSISTOR USING CATALYST ELEMENTS TO PROMOTE CRYSTALLIZATION

This is a Continuation in Part application of Ser. No. 08/347,247 filed on Nov. 23, 1994.

BACKGROUND OF THE INVENTION

1. Industrial Field of Application

The present invention relates to a semiconductor device using crystalline semiconductor, and to a method for fabricating the same.

2. Discussion of Prior Art

Thin film transistors (referred to simply hereinafter as "TFTs") are well known as devices utilizing thin film semiconductors. The TFTs are fabricated by forming a thin film semiconductor on a substrate and processing the thin film semiconductor thereafter. The TFTs are widely used in various types of integrated circuits, and are particularly noticed in the field of switching elements that are provided to each of the pixels of active matrix liquid crystal display devices as well as in driver elements of the peripheral circuits thereof.

Amorphous silicon films can be utilized most readily as the thin film semiconductors for TFTS. However, an amorphous silicon film has a problem that the electrical characteristics thereof are inferior. This problem can be circumvented by using a thin film of crystalline silicon. Crystalline silicon film is also denoted as, for example, polycrystalline silicon, polysilicon and microcrystalline silicon. A thin film of crystalline silicon can be prepared by first forming a thin film of amorphous silicon, and then crystallizing it by heat treatment.

The heat treatment for the crystallization of the amorphous silicon film requires heating the film at a temperature of 600° C. or higher for a duration of 10 hours or longer. Such a heat treatment has a problem that a glass substrate cannot be used. For instance, a Corning 7059 glass commonly used for the substrate of an active matrix liquid crystal display device has a glass distortion point of 593° C., and is therefore not suitable for large area substrates that are subjected to heating at a temperature of 600° C. or higher.

SUMMARY OF THE INVENTION

According to the study of the present inventors, it is found that the crystallization of an amorphous silicon film can be effected by heating the film at 550° C. for a duration of about 4 hours. This can be accomplished by first introducing a trace amount of nickel or palladium, or other elements such as lead, into the surface of the amorphous silicon film.

The elements above (catalyst elements capable of accelerating the crystallization of an amorphous silicon film) can be introduced into the surface of the amorphous silicon film by plasma treatment or vapor deposition, or by ion implantation. The plasma treatment is a method comprising adding the catalyst elements onto the amorphous silicon film by generating a plasma of an atmosphere such as gaseous nitrogen or gaseous hydrogen in a plasma CVD apparatus of a parallel plate type or of a positive column type, while using a material containing catalyst elements as an electrode.

However, the presence of the catalyst elements in a large quantity in the semiconductor is not preferred, because the use of such semiconductors greatly impairs the reliability and the electric stability of the device in which the semiconductor is used. That is, the elements such as nickel which accelerate the crystallization (catalyst elements) are necessary in the crystallization of the amorphous silicon film, but are preferably not incorporated in the crystallized silicon. These objects can be accomplished by selecting an element which tends to be inactive in crystalline silicon as the catalyst element, and by incorporating the catalyst element at a minimized amount for the crystallization of the film. Accordingly, the quantity of the catalyst element to be incorporated in the film must be controlled with high precision.

Also, in case of using nickel as the catalyst element, a crystalline silicon film was fabricated from an amorphous silicon film by adding nickel by plasma treatment, and the crystallization process and the like was studied in detail to obtain the following findings as a result:

(1) In case of incorporating nickel by plasma treatment into an amorphous silicon film, nickel is found to intrude into the film to a considerable depth of the amorphous silicon film before subjecting the film to heat treatment.

(2) The initial nucleation occurs from the surface from which nickel is incorporated.

(3) When a nickel layer is deposited on the amorphous silicon film by vapor deposition, the crystallization of an amorphous silicon film occurs in the same manner as in the case of effecting plasma treatment.

It can be concluded from the above findings that not all of nickel atoms incorporated by plasma treatment into the amorphous silicon film function effectively, and that, more importantly, only a trace amount of nickel need to be incorporated in the vicinity of the surface of the amorphous silicon film. Assumably, a point (or a plane) at which silicon is brought into contact with nickel contributes to the low temperature crystallization of amorphous silicon. Conclusively, nickel atoms are preferably dispersed as finely as possible to accelerate the crystallization reaction. In other words, "nickel atoms need to be introduced in the vicinity of the surface of amorphous silicon film at a minimum concentration necessary for the low temperature crystallization of the amorphous silicon film".

A trace amount of nickel, i.e., a catalyst element capable of accelerating the crystallization of the amorphous silicon, can be incorporated in the vicinity of the surface of the amorphous silicon film by, for example, vapor deposition. However, vapor deposition is disadvantageous concerning the controllability of the film, and is therefore not suitable for controlling precisely the amount of the catalyst element that is incorporated in the amorphous silicon film.

In particular, the crystals can be grown in parallel with the plane of catalyst element the silicon film from the region onto which the solution is applied to the region onto which the solution is not applied. It is also confirmed that this region of crystal growth contains the catalyst element at a low concentration and that it is extremely useful to utilize such a crystalline silicon film as an active layer region for a semiconductor device. However, there remains a problem how to selectively introduce the catalyst elements.

An object of the present invention is to provide a method for fabricating a thin film semiconductor of crystalline silicon, characterized in that it satisfies the following requirements:

(1) The catalyst element is introduced at a controlled and at a minimum possible quantity;

(2) The catalyst element is introduced into selected portions; and (3) The process yields high productivity.

The present invention uses the following means to accomplish the object above. Specifically, a mask-patterned amorphous silicon film is crystallized by bringing it into contact with either a pure catalyst element which accelerates the crystallization of the amorphous silicon film or a compound containing the catalyst element, while applying heat treatment thereto.

More specifically, a solution containing the catalyst element is applied to the surface of an amorphous silicon film having a desired pattern formed thereon using a resist. In this manner, the catalyst element is introduced into the surface of the amorphous silicon film.

DETAILED DESCRIPTION OF THE PREFERRED EMBODIMENTS

Figure 1A:
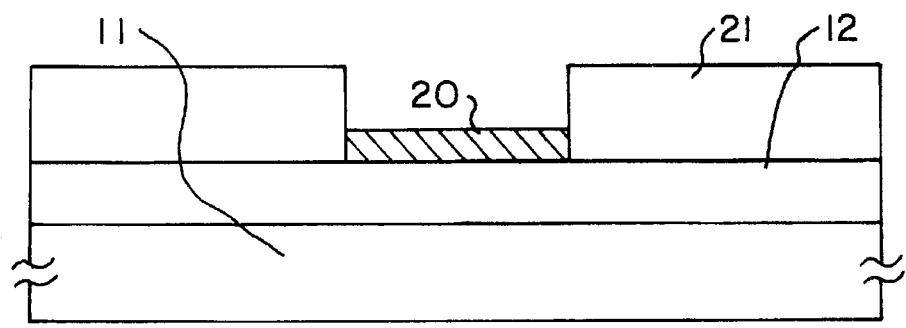
FIGS. 1(A)–1(C) shows a method of the present invention.

The present invention is characterized in that the catalyst element is introduced by bringing it into contact with the surface of the amorphous silicon film having a pattern formed thereon by using a resist.

The present invention is also characterized in that the thin film crystalline silicon thus crystallized using the catalyst element is employed in the constitution of an active region having at least one of the electric junctions such as a PN, a PI, and an NI junction of the semiconductor device. Specifically mentioned as the semiconductor devices are a thin film transistor (TFT), a diode, and an optical sensor.

The present invention are basically advantageous in the following aspects:

(a) The concentration of the catalyst element in the solution can be strictly controlled to a minimum and optimum value suitable for increasing the crystallinity of the thin film silicon;

(b) The quantity of the catalyst element introduced in the amorphous silicon film can be controlled by adjusting the concentration of the catalyst element in the solution so long as the solution is brought into contact with the surface of the amorphous silicon film;

(c) The catalyst element can be introduced into the amorphous silicon film at an amount as low as possible, because the catalyst element adsorbed by the surface of the amorphous silicon film principally contributes to the crystallization of silicon; and (d) The catalyst element can be selectively introduced into the surface of the amorphous silicon film by using a resist pattern; thus, a semiconductor device utilizing the region crystallized alone the transverse direction can be easily fabricated.

The solution containing a catalyst element for accelerating the crystallization can be applied to the surface of the amorphous silicon film by using, for example, an aqueous solution or a solution based on an organic solvent. The "solution" as referred herein encompasses those containing the catalyst element in the form of a compound dissolved in the solution, and those containing the element in the form of a dispersion. Preferably the kind of the solution is selected by taking the affinity of the solvent with the catalyst element into consideration. It is also preferred to consider the contact angle of the solution and the surface of the thin film in selecting the solution. When a fine pattern is formed, in particular, a material having a small contact angle is preferably used to process the amorphous silicon film deeply into the pattern.

The solvent containing the catalyst element may be selected from various types of polar solvents such as water, an alcohol, an acid, or ammonia.

When nickel is used as the catalyst, it may be added in a polar solvent in the form of a nickel compound. More specifically, it may be selected from a group of representative nickel compounds, i.e., nickel bromide, nickel acetate, nickel oxalate, nickel carbonate, nickel chloride, nickel iodide, nickel nitrate, nickel sulfate, nickel formate, nickel acetylacetonate, nickel 4-cyclohexylbutyrate, nickel oxide, and nickel hydroxide.

Otherwise, a non-polar solvent can be used in the solution containing the catalyst element. For example, a solvent selected from benzene, toluene, xylene, carbon tetrachloride, chloroform, ether, trichloroethylene, and Freon can be used as well. It should be noted, however, that "polarity" is referred herein not in a strict sense considering dipole moment, but in a general sense based on chemical characteristics.

In this case, nickel is incorporated in the solution in the form of a nickel compound. Representative compounds to be mentioned include nickel acetylacetonate and nickel 2-ethylhexanoate.

It is also useful to add a surface active agent into the solution containing the catalyst element. The surfactant increases the adhesion strength of the solution and controls the adsorptivity. The surfactant may be applied previously to the surface of the substrate onto which the amorphous silicon is deposited.

When metallic nickel is used as the catalyst, it may be dissolved into an acid to provide a solution.

The description above is for a case nickel is dissolved completely in a solution. Nickel need not be completely dissolved in a solution, and other materials, such as an emulsion comprising metallic nickel or a nickel compound in the form of a powder dispersed in a dispersant may be used as well.

The same as those mentioned in the foregoing applies to the case in which a catalyst element other than nickel is used.

When nickel is used as the catalyst element for accelerating the crystallization of amorphous silicon, it may be incorporated in a polar solvent such as water. However, on applying the solution to a thin film of amorphous silicon directly, the solution is sometimes found to be repelled by the surface of the amorphous silicon. This can be circumvented by forming a thin oxide film 100 Å or less in thickness, and then applying a solution containing the catalyst element thereon. In this manner, a uniform coating can be formed on the surface of amorphous silicon. It is also useful to improve the wettability of the amorphous silicon with the solution by adding a surfactant and the like into the solution.

A solution can be directly applied to the surface of an amorphous silicon m by using a non-polar solvent such as toluene. For instance, a toluene solution of nickel 2-ethylhexanoate can be used favorably in such a case. It is also effective in this case to previously apply an adhesive or a like material commonly used in the case of forming, a resist coating However, such an agent must be treated with care lest it should be applied to an excessive amount, because the presence of the additive in excess obstructs the addition of a catalyst element inside amorphous silicon.

The concentration of the catalyst element in the solution depends on the kind of the solution, however, roughly speaking, the concentration of nickel by weight is from 1 ppm to 200 ppm, and preferably, from 1 ppm to 50 ppm. The concentration is determined based on the nickel concentration or the resistance against hydrofluoric acid of the film upon completion of the crystallization.

The crystal growth can be controlled by applying the solution containing the catalyst element to the selected portions of the amorphous silicon film. In particular, the crystals can be grown in parallel with the plane of the silicon film from the region onto which the solution is applied to the region onto which the solution is not applied. The region in which the crystals are grown in parallel with the plane of the amorphous silicon film is referred to as the region crystallized in the lateral direction.

It is also confirmed that this region crystallized in the lateral direction contains the catalyst element at a low concentration. It is useful to utilize a crystalline silicon film as an active layer region for a semiconductor device, however, in general, the concentration of the impurity in the active region is preferably as low as possible. Accordingly, the use of the region crystallized in the lateral direction for the active layer region is useful in fabricating a device.

The use of nickel as the catalyst element is particularly effective in the method according to the present invention. However, other useful catalyst elements can be used as well. Such catalyst elements include Ni, Pd, Pt, Cu, Aa, Au, In, Sn, Pd, Sn, Pd, P, As, and Sb. Otherwise, the catalyst element may be at least one selected from the elements belonging to the Group VIII, IIIB, IVb, and Vb of the periodic table. When iron (Fe) is selected as the catalyst element, an iron salt selected from compounds such as ferrous bromide ($FeBr_2.6H_2O$), ferric bromide ($FeBr_3.6H_2O$), ferric acetate ($Fe(C_2)H_3O_2)_3.xH_2O$), ferrous chloride ($FeCl_2.4H_2O$), ferric chloride ($FeCl_3.6H_2O$), ferric fluoride ($FeF_3.3H_2O$), ferric nitrate ($Fe(NO_3)_3.9H_2O$), ferrous phosphate ($Fe(PO_4)_2.8H_2O$), and ferric phosphate ($FePO_4.2H_2O$) can be used.

In case cobalt (Co) is used as the catalyst element, useful compounds thereof include cobalt salts such as cobalt bromide ($CoBr.6H_2O$), cobalt acetate ($Co(C_2H_3O_2)_2.4H_2O$), cobalt chloride ($CoCl_2.6H_2O$), cobalt fluoride ($CoF_2.xH_2O$), and cobalt nitrate ($Co(NO_3)_2.6H_2$).

A compound of ruthenium (Ru) can be used in the form of a ruthenium salt, such as ruthenium chloride ($RuCl_3.H_2O$).

A rhodium (Rh) compound is also usable in the form of a rhodium salt, such as rhodium chloride ($RhCl_3.3H_2O$).

A palladium (Pd) compound is also useful in the form of a palladium salt, such as palladium chloride ($PdCl_2.2H_2O$).

In case osmium (Os) is selected as the catalyst element, useful osmium compounds are osmium salts such as osmium chloride ($OsCl_3$).

If iridium (Ir) is selected as the catalyst element, a compound selected from iridium salts such as iridium trichloride ($IrCl_3.3H_2O$) and iridium tetrachloride ($IrCl_4$) can be used.

In case platinum (Pt) is used as the catalyst element, a platinum salt such as platinic chloride ($PtCl_4.5_2O$) can be used as the compound.

In case copper (Cu) is used as the catalyst element, a compound selected from cupric acetate ($Cu(CH_3COO)_2$), cupric chloride ($CuCl_2.2H_2O$), and cupric nitrate ($CU(NO_3)_2.3H_2O$) can be used.

In using gold (Au) as the catalyst element, it is incorporated in the form of a compound selected from auric trichloride ($AuCl_3.xH_2O$), auric, chloride ($AuHCl_4.4H_2O$), and sodium auric tetrachloride ($AuNaCl_4.2H_2O$).

The catalyst elements can be incorporated not only by using a solution such as an aqueous solution and an alcohol solution, but also by using a substance selected from a wide variety of materials containing the catalyst element. For instance, metal compounds and oxides containing the catalyst element can be used as well.

EXAMPLES

Example 1

The present example refers to a method which comprises forming a desired mask pattern on the surface of an amorphous silicon film using a resist mask, and then introducing nickel into selected portions of the amorphous silicon film by applying a solution containing nickel to the surface of the amorphous silicon film having thereon the mask pattern.

Figure 1B:
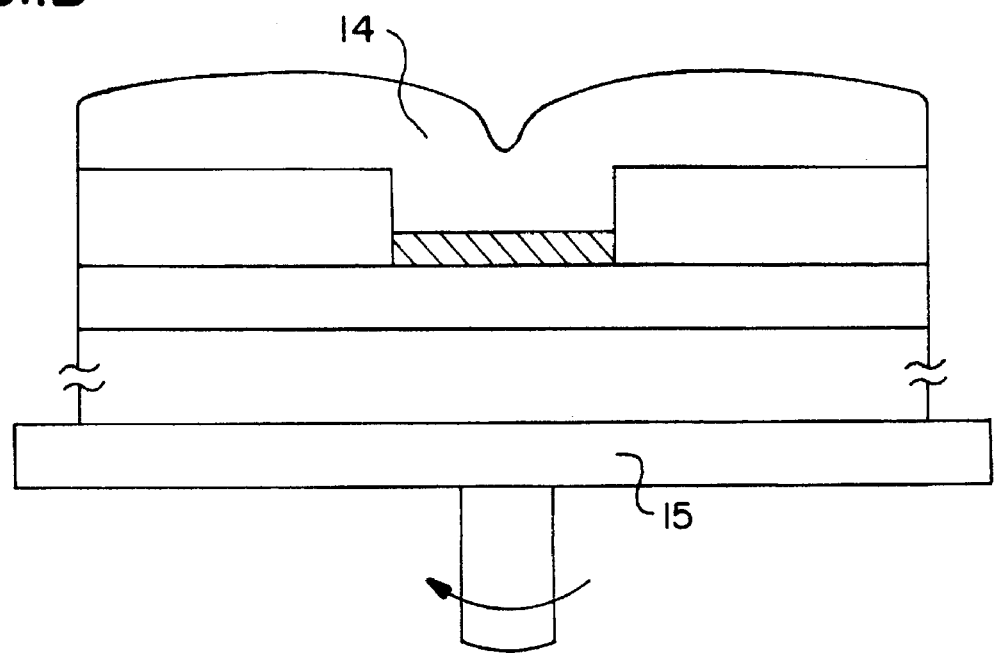

Referring to FIG. 1, the method according to the present example is described below. First, a resist pattern 21 is formed as a mask on a glass substrate (a Corning 7059 class substrate, 100 mm×100 mm). Either a positive or a negative resist can be used.

The resist mask 21 is patterned as desired by means of an ordinary patterning process using photolithography. A thin silicon oxide film 20 is deposited thereafter by irradiating an ultraviolet radiation in gaseous oxygen. The thin silicon oxide film 20 can be fabricated by irradiating the UV light for a duration of 5 minutes under gaseous oxygen. Assumably, a silicon oxide film 20 about 20 to 50 Å in thickness is obtained in this step (FIG. 1(A)).

The ultrathin silicon oxide film 20 thus obtained is provided for an aim to improve the wettability of amorphous silicon film 12 on applying thereto a nickel-containing solution in the later step. Instead of irradiating a UV light, the oxide film can be formed by immersing the substrate into aqueous hydrogen peroxide heated to 70° C. for a duration of 5 minutes. A thermally oxidized film can be used as well.

After forming the oxide film, 5 ml (in case of a substrate 10×10 cm$^2$ in area) of an aqueous acetate solution containing nickel at a concentration of 100 ppm by weight is applied dropwise to the substrate. After spincoating the surface of the substrate by operating a spinner at 50 rpm for a duration of 10 seconds to obtain a uniform aqueous coating on the entire surface, the substrate is maintained as it is for a duration of 5 minutes. Spin drying at 2,000 rpm is effected for 60 seconds thereafter. The retention of the aqueous coating on the surface of the substrate can be effected on a spinner, while rotating the substrate at a rate of 150 rpm or lower (FIG. 1(B)).

The resist mask 21 is removed thereafter by oxygen ashing to selectively form a region containing nickel adsorbed thereon. Instead of using oxygen ashing, the resist mask can be removed by annealing it in oxygen.

Figure 1C:
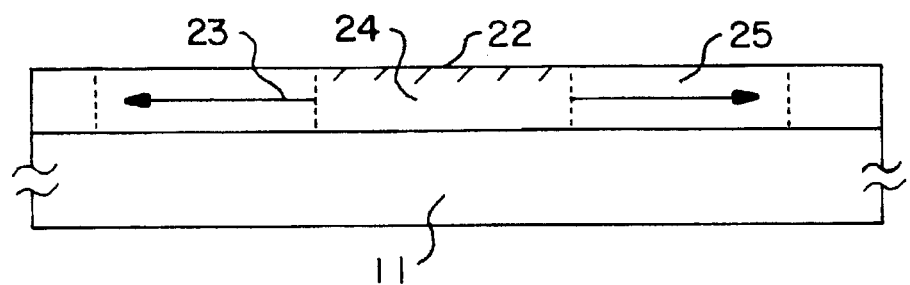
Figure 2A:
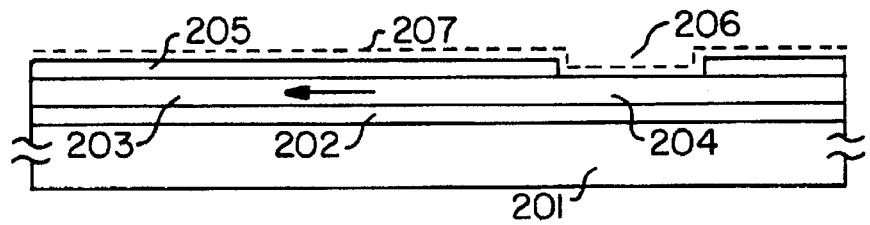
FIGS. 2(A)–2(F) shows a process of fabrication of an embodiment of the present invention.
Figure 2B:
Figure 2C:
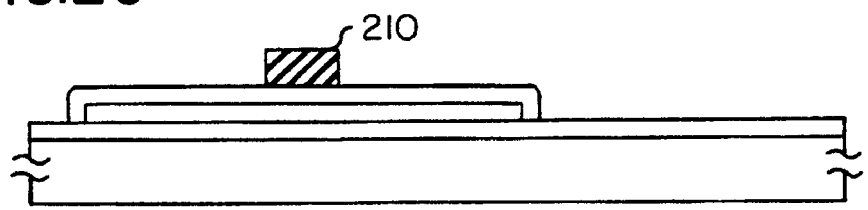
Figure 2D:
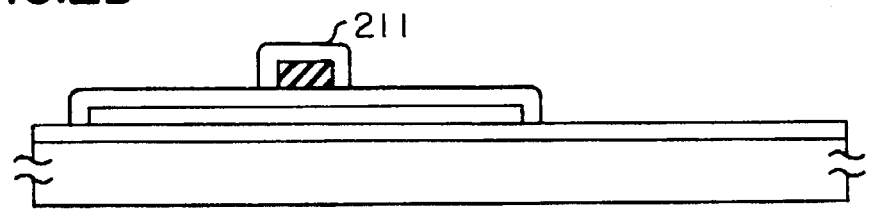
Figure 2E:
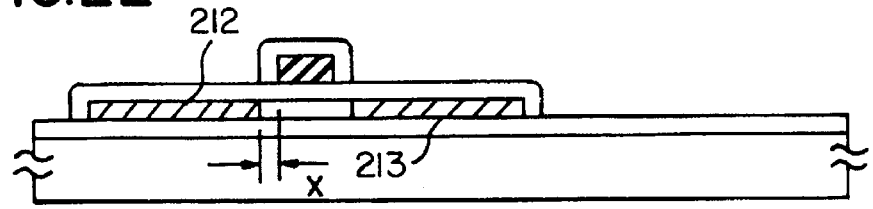
Figure 2F:
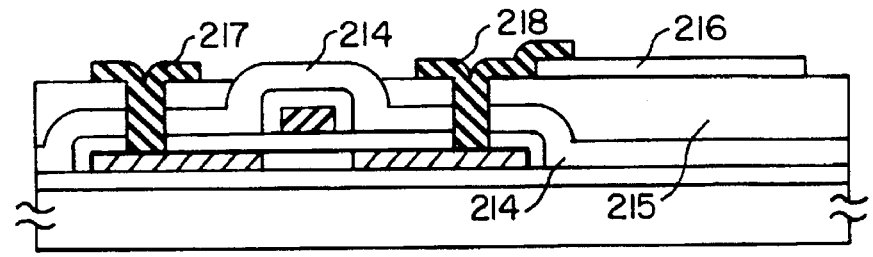

The amorphous silicon film 12 is crystallized thereafter by applying a heat treatment at 550° C. (in gaseous nitrogen) for a duration of 4 hours. It is found that the crystal growth occurs from the region 22 into which nickel is incorporated, towards the region 23 in which nickel is not introduced. Referring to FIG. 1(C), nickel is directly introduced into the region 24. Upon crystallizing the region 24, it can be seen that the crystallization proceeds in the lateral direction to provide a region 25. It is confirmed that crystals in the crystallized region 25 grow approximately along the direction of the crystallographic <111> axis.

It is also useful to employ annealing after the step of crystallization. The annealing is effected by using a laser radiation or an intense light equivalent thereto. A thin film of crystalline silicon further improved in crystallinity can be obtained. A laser beam emitted from a KrF excimer laser or a XeCl laser can be used. An infrared radiation is also useful for the annealing. Annealing can be effectively carried out by using an infrared radiation, because infrared light is selectively absorbed by silicon and not by the glass substrate.

By controlling the concentration of the solution and the duration of retention of the solution on the surface of the amorphous silicon film, it is possible to control the concentration of nickel in the region of direct addition to a range of from $1\times10^{16}$ atoms.cm$^{-3}$ to $1\times10^{19}$ atoms.cm$^{-3}$. At the same time, the concentration of nickel in the region of lateral crystal growth can be controlled to a range lower than that of the region above.

The crystalline silicon film thus obtained according to the method of the present example is characterized in that it yields an excellent resistance against hydrofluoric acid. This is in clear contrast with the case in which nickel is introduced by a plasma process, because in accordance with the findings of the present inventors, thin film crystalline silicon obtained by crystallizing an amorphous silicon film after introducing nickel by a plasma process is inferior with respect to the resistance against hydrofluoric acid.

For instance, the poor resistance against hydrofluoric acid is critical in case of providing an electrode by perforating a silicon oxide film deposited as a gate dielectric or an interlayer insulating film on the surface of the thin film crystalline silicon. In such a case, in general, the silicon oxide film is removed by using a buffered hydrofluoric acid. If a thin film crystalline silicon inferior in resistance against hydrofluoric acid is used, it is found extremely difficult to remove the silicon oxide film alone without causing, damage to the thin film crystalline silicon.

However, if a thin film crystalline silicon having a sufficiently high resistance against hydrofluoric acid is used, the silicon oxide film alone can be removed selectively by taking the advantage of the large difference (selectivity ratio) between the etching rate of the silicon oxide film and the thin film crystalline silicon.

As described in the foregoing, the region of lateral crystal growth yields a high crystallinity, and yet, is very low in the concentration of the catalyst element. Accordingly, the use of this region for the active layer region is useful in fabricating a device. More specifically, the use of this region as a channel region of a thin film transistor is particularly useful.

Example 2

The present example relates to a case in which a catalyst element, nickel, is incorporated into a non-aqueous solvent, alcohol, and is applied to the surface of an amorphous silicon film. In the present case, nickel is added into alcohol in the form of nickel acetylacetonate. The concentration of nickel is adjusted as desired. The process steps thereafter are the same as those described in Example 1.

The present example is described in further detail below. First of all, nickel acetylacetonate is prepared for use as the starting material. Nickel acetylacetonate is soluble to alcohol, and decomposes at a low temperature. Accordingly, it can be readily decomposed by the heat during the crystallization step.

Ethanol is used as the alcohol. Nickel acetylacetonate is added into ethanol at such a concentration that nickel should be present in the solution at a concentration of 100 ppm.

The resulting solution is applied to the surface of an amorphous silicon film having already thereon a desired resist pattern formed by using Photonese. Photonese is used specifically in this case because it does not dissolve into alcohol after it is baked at 300° C. The amorphous silicon film used in this case is a film 1,000 Å in thickness, which is deposited by means of plasma CVD on a 100×100-mm$^2$ area glass substrate having thereon a base silicon oxide film (2,000 Å in thickness).

A smaller amount of solution is necessary in this case as compared with the case using an aqueous solution as in Example 1. This is ascribed to the fact that the contact angle of alcohol is smaller than that of water. Thus, 2 ml of the solution is added dropwise to an area of 100×100 mm$^2$.

The resulting state is retained for a duration of 5 minutes and dried thereafter using a spinner. Drying is effected by operating the spinner at 1.500 rpm for a duration of 1 minute. Nickel salt is decomposed by heating the dried substrate at 350° C. for a duration of 60 minutes. Thus, in this manner, nickel as a catalyst element can be introduced into the amorphous silicon film by allowing it to diffuse into amorphous silicon film. The Photonese mask is removed thereafter by wet etching using hydrazine or by ashing. A crystalline silicon film can be obtained in this manner by carrying out the crystallization process at 550° C. for a duration of 4 hours.

As a matter of course, similar to the case as described in Example 1, crystal growth occurs in the lateral direction from the region into which the catalyst element is introduced to the region into which no catalyst element is added. Thus, a region of crystalline silicon is obtained extending in the lateral direction.

Example 3

The present example relates to a case in which nickel is introduced as the catalyst element into selected portions of an amorphous silicon film by forming an oxide m containing nickel on an amorphous silicon film having thereon a resist pattern.

In the present example, an OCD solution containing a catalyst element for accelerating the crystallization is used to form an oxide film containing the catalyst element on the amorphous silicon film, and the oxide film is crystallized thereafter by heating. The OCD solution as referred herein is Ohka Diffusion Source manufactured by Tokyo Ohka Kogyo Co., Ltd., and it comprises an organic solvent dissolved therein a silicon compound and additives. The OCD solution is useful, because a silicon oxide film can be readily obtained by applying the solution to an object and baking it thereafter. Furthermore, a silicon oxide film containing impurities can be easily obtained by using this solution.

A Corning 7059 glass substrate 100 mm×100 mm in area is used in the present example.

An amorphous silicon film from 100 to 1,500 Å in thickness is deposited by plasma CVD or LPCVD. More specifically in this case, an amorphous silicon film was deposited at a thickness of 1.000 Å.

The resulting substrate is subjected to a treatment using hydrofluoric acid to remove stains and natural oxide films, and a resist pattern is formed as desired. It should be noted that a resist material having a sufficiently high resistance against the organic solvent in the OCD solution is selected in this case.

An oxide film containing nickel as the catalyst element is formed thereafter. Referring to FIG. 1, the oxide film is formed in the manner described below on the portion indicated with numeral 14 corresponding to the solution referred in Example 1.

A solution containing 0.2% by weight Of SiO₂ and from 200 to 2,000 ppm of nickel is prepared by mixing an OCD solution, i.e., OCD Type 2 Si 59000 manufactured by Tokyo Ohka Kogyo Co., Ltd., with a methyl acetate solution containing dissolved therein nickel (II) acetylacetonate.

Then, 10 ml of the resulting solution is applied dropwise to the surface of amorphous silicon film. Spin coating is effected by operating a spinner at a rate of 2,000 rpm for a duration of 15 seconds. A silicon oxide film containing nickel is formed at a thickness of about 1,300 Å by effecting, prebaking at 150° C. for a duration of 30 minutes. The temperature of prebaking can be determined by taking the decomposition temperature of the nickel compound into consideration.

The resist is removed thereafter using a stripping solution. Then, the resulting structure is subjected to heat treatment at 550° C. for a duration of 4 hours under gaseous nitrogen in a heating furnace. As a result, a crystalline thin film of silicon can be obtained on the substrate. At the same time, crystal growth occurs in the lateral direction from the region into which nickel is introduced towards the region into which no nickel is added.

The heat treatment above can be carried out at a temperature of 450° C. or higher. If the heat treatment were to be effected at a lower temperature, the treatment must be effected for a longer duration. Such a long treatment unfavorably impairs the production efficiency. If heating at a temperature of 550° C. were to be carried out, on the other hand, the problem of heat resistance of the glass substrate must be overcome.

The concentration of nickel in the OCD solution cannot be determined alone, and is determined in correlation with the concentration of SiO₂ in the solution. Furthermore, the concentration of nickel must be determined by taking other factors into consideration, because the amount of nickel which diffuses from the silicon oxide film obtained from the OCD solution into the thin film crystalline silicon differs depending on the temperature and the duration of heating.

Example 4

The present example relates to a method for fabricating an electronic device by using a region obtained by introducing nickel into selected regions and then allowing crystal growth to occur in the lateral direction (a direction in parallel with the surface of the substrate). The concentration of nickel in the active layer of the device can be further lowered by employing the constitution according to the present example. This constitution is extremely favorable from the viewpoint of electric stability and reliability of the device.

Nickel can be incorporated by any of the methods described in the foregoing Examples 1 to 3.

The present example relates to a method for fabricating a TFT for use in controlling pixels of an active matrix addressed device. Referring to FIG. 2, the method for fabricating the TFT according to the present example is described below. First, a substrate 201 is cleaned, and a base silicon oxide film 202 is deposited thereon at a thickness of 2,000 Å by means of plasma CVD using gaseous TEOS (tetraethoxysilane) and oxygen as the starting materials. Then, an intrinsic (I-type) amorphous silicon film 203 is deposited at a thickness of from 500 to 1,000 Å. For instance, an I-type amorphous silicon film 203 is formed at a thickness of 1,000 Å in this case. A resist mask 205 is formed thereafter. A region of exposed amorphous silicon is obtained in this manner.

Subsequently, a solution (specifically, an acetate solution) containing, nickel as the catalyst element for accelerating the crystallization is applied according to the method described in Example 1. The nickel concentration is 100 ppm. The details and the process steps are the same as those described in Example 1. This step of coating may otherwise be effected by either of the processes described in Examples 2 and 3.

The silicon film 303 is crystallized thereafter by effecting annealing at a temperature in the range of from 500° to 620° C., for example, at 550° C., for a duration of 4 hours. The crystallization initiates from the region 206, i.e., a region in which the silicon film is brought into contact with nickel, and proceeds along a direction in parallel with the substrate as indicated with an arrow in the figure. It can be seen in the figure that region 204 is crystallized by directly introducing nickel, and that region 203 is crystallized in the lateral direction. The region 203 crystallized in the lateral direction is composed of crystals about 25 μm in size. Furthermore, it is confirmed that crystals in the crystallized region 203 grow approximately along the direction of the crystallographic <111>axis (FIG. 2 (A)).

The silicon oxide film 205 is removed thereafter. The oxide film formed on the surface of the region 206 is removed at the same time. After patterning the silicon film 204, an island-like active layer region 208 is formed by dry etching. Referring to FIG. 2 (A), the region 206 represents the region rich in nickel, because nickel is introduced directly therein. It is also confirmed that the front end of crystal growth contains nickel at a high concentration. Such regions contain nickel in a concentration higher than those in the intermediate regions. Accordingly, the method according to the present example is designed as such that the channel forming region in the active layer 208 does not overlap those regions containing nickel at high concentration.

The surface of the active layer (silicon film) 208 is oxidized to form a silicon oxide film 209. The silicon oxide film 209 is obtained by allowing the active layer 208 to stand in an atmosphere containing 100% by volume of water vapor under a pressure of 10 atoms and at a temperature in the range of from 500° to 600° C., representatively, at 550° C. Thus is obtained the silicon oxide film 209 at a thickness of 1,000 Å. By thus forming the silicon oxide film 209 by thermal oxidation, the entire substrate is maintained at 400° C. under 100% gaseous ammonia at 1 atm.

The silicon oxide film 209 is subjected to nitriding by irradiating an infrared radiation having a peak intensity in a wavelength range of from 0.6 to 4 μm, more preferably, for example, in a range of from 0.8 to 1.4 μm for a duration of 30 to 180 seconds. The atmosphere under which the process is effected may contain from 0.1 to 10% of gaseous HCl.

Halogen lamp is used as the light source of the infrared radiation. The intensity of the infrared radiation is controlled as such that the temperature as monitored on a single crystal silicon wafer may fall in a range of from 900° to 1,200° C. More specifically, the temperature is monitored on the silicon wafer using a thermocouple buried in the wafer, and the detected value is fed back to the light source. In the present example, the temperature is elevated at a constant rate in a range of from 50° to 200° C./sec, and is allowed to cool naturally at 20° to 100° C./sec. The method using infrared radiation is preferred, because infrared radiation selectively heats the silicon film. Thus, the heat effect to the glass substrate is minimized (FIG. 2 (B)).

Subsequently, an aluminum film is deposited at a thickness in a range of from 3,000 to 8,000 Å by sputtering. For instance, a 6,000 Å thick aluminum (containing from 0.01 to 0.2% of scandium) is deposited. The aluminum film thus obtained is patterned to obtain a gate electrode 210 (FIG. 2 (C)).

The surface of the thus obtained aluminum electrode is anodically oxidized thereafter to form an oxide layer 211 on the surface thereof. The process of anodic oxidation is effected in an ethylene glycol solution containing from 1 to 5 % of tartaric acid. Thus is obtained a 2,000 Å thick oxide layer 211 on the surface of the aluminum electrode. Because the thickness of the oxide layer 211 thus obtained corresponds to the length of the offset gate region that is formed in the later step of ion doping, the length of the offset gate region can be determined in this step of anodic oxidation (FIG. 2 (D)).

Then, by means of ion doping process (also known as plasma doping process), an impurity (phosphorus) for rendering the portion N-conductive is added into the active layer region (which constitutes source/drain and a channel) in a self-aligned manner using the gate electrode portion, i.e., the gate electrode 210 and the surrounding oxide layer 211. In the present example, phosphine ($PH_3$) is introduced as the doping gas to implant phosphorus at a dose in a range of from $1\times10^{15}$ to $8\times10^{15}$ cm$^{-2}$, for example, at a dose of $4\times10^{15}$ cm$^{-2}$ by applying an accelerating voltage of from 60 to 90 kV, for example, at 80 kV. N-type impurity regions 212 and 213 are formed as a result. It can be seen from the figure that the impurity region is formed offset from the gate electrode for a distance of x. Such an offset structure is effective, because the leak current (sometimes referred to as an "off current"), which is observed when a reversed voltage (i.e., a negative value in case of an N-channel TFT) is applied to the gate electrode, can be effectively lowered. Particularly in a TFT for use in the control of a pixel electrode as in the present example, the leak current is preferably as low as possible. By lowering the leak current, the charge can be accumulated in the pixel electrode to reproduce favorable images.

Annealing is effected by irradiating a laser beam using a KrF excimer laser (operating at a wavelength of 248 nm and a pulse width of 20 nsec). The laser is operated to provide from 2 to 10 shots per site, for example, 2 shots per site, at an energy density of from 200 to 400 mJ/cm$^2$, for instance, at 250 mJ/cm$^2$. Furthermore, a more effective annealing can be realized by heating the substrate in a range of from about 200° to 450° C. (FIG. 2 (E)).

Then, a 6,000 Å thick silicon oxide film 214 is deposited as an interlayer insulating layer by means of plasma CVD. Furthermore, a transparent polyimide film 215 is formed thereon by spin coating to obtain a planarized surface. A 800 Å thick clear conductive film (an ITO film) is deposited By sputtering on the thus obtained planarized surface, and is patterned to provide a pixel electrode 216.

Contact holes are formed in the interlayer insulating layers 214 and 215. Thus, electrode and interconnection 217 and 218 are formed by using film comprising titanium nitride and aluminum. Finally, a pixel circuit having a TFT for an active matrix device is obtained by annealing the resulting structure at 350° C. for a duration of 30 minutes under gaseous hydrogen at 1 atm.

As described above, the method according to the present invention provides a high performance semiconductor device with high productivity by using a crystalline silicon film which is obtained by a rapid and low temperature crystallization process. This rapid and low temperature crystallization is realized by selectively introducing a catalyst element using a resist.

In the example above, a layer containing a catalyst was formed on the surface of the substrate by applying a solution containing the catalyst. However, it should be noted that it is also in the scope of the present invention a method which comprises forming previously a layer containing the catalyst on the substrate, and then depositing thereon an amorphous silicon film.

These are some methods to perform solid phase crystallization by using a metal catalyst. In using such metal catalyst elements, including Ni, Fe, Co, Ru, Rh, Pd, Os, Ir, Pt, Cu, Au, etc., the conventional method was physical formation such as sputtering method, electron beam evaporation method, etc.

In this case, a film including the catalyst of 5 to 200 Å in average thickness, e.g. 10 to 50 Å thick is formed in an island-form on a surface. That is, the catalyst element is dotted on the surface in the form of micrograins with an average diameter of 50 to 200 Å. The grain are separated from each other by approximately 100 to 1000 Å. In other words, it does not form a continuous film in any way, but forms a discontinuous film. Consequently, the metal islands form nuclei for crystallization. Crystals are grown from the nuclei in an amorphous silicon film on an insulating substrate by means of a thermal treatment at 450° C. to 600° C.

In the above conventional method, the crystallization temperature can be dropped by 50° to 100° C., in comparison to when such catalyst elements are not used for the crystallization. However, the following thing became clear as a result of observing the crystallized film carefully. A number of amorphous regions are left and that such regions have a metallic property. It is presumed that the metal catalyst is left as they are.

These metal regions form recombination centers of electrons and halls. Adding a reverse bias voltage to a semiconductor device, in particular, PI or NI junction because of the metal region existing in the junction region, it has quite inferior characteristics in that a leak current is increased. When thin-film transistors of channel length/channel width =8 μm/8 μm is formed with such a semiconductor layer, the Off-state current is $10^{-10}$ to $10^{-6}$ A, which is $10^2$ to $10^6$ times larger than $10^{12}$ although an OFF=state current should be as small as about $10^{12}$ A.

The present invention aims at giving the chemical formation method which is quite different from above. In order to solve the problem above, it is a characteristic of the present invention to form a catalytic layer by using a solution (water, isopropyl alcohol, etc.) which contains a metal organic compound at a concentration 10 ppm to 100 ppm. For example, the following metal complex salt can be used as the metal compound. Namely, ferrous bromide ($FeBr_2$ $6H_2O$), ferric bromide ($FeBr_3$ $6H_2O$), ferric acetate ($Fe(C_2H_3O_2)_3$ $xH_2O$), ferrous chloride ($FeCl_2$ $4H_2O$), ferric chloride ($FeCl_3$ $6H_2O$), ferric fluoride ($FeF_3$ $3H_2O$), ferric nitrate ($Fe(NO_3)_3$ $9H_2O$), ferrous phosphate ($Fe_3(PO_4)_2$ $8H_2O$), ferric phosphate ($FePO_4$ $2H_2O$), cobalt bromide ($CoBr$ $6H_2O$), cobalt acetate ($Co(C_2H_3O_2)_2$ $4H_2O$), cobalt chloride ($CoCl_2$ $6H_2O$), cobalt fluoride ($CoF_2$ $xH_2O$), cobalt nitrate ($Co(NO_3)_2$ $6H_2O$), ruthenium chloride ($RuCl_3$ $H_2O$), rhodium chloride ($RhCl_3$ $3H_2O$), palladium chloride ($PdCl_2$ $2H_2O$), osmium chloride ($OsCl_3$), iridium trichloride ($IrCl_3$ $3H_2O$), iridium tetrachloride ($IrCl_4$), platinic chloride ($PtCl_4$ $5H_2O$), cupric acetate ($Cu(CH_3COO)_2$), cupric chloride ($CuCl_2$ $2H_2O$), cupric nitrate ($CU(NO_3)_2$ $3H_2O$), auric trichloride ($AuCl_3$ $xH_2O$), auric chloride ($AuHCl_4$ $4H_2O$), sodium auric tetrachloride ($AuNaCl_4$ $2H_2O$).

The above materials can be dispersed in a solution in a monomolecular form. This solution can be spread on an entire surface of a substrate by spin coating in which the solution is dropped and then the substrate is rotated at a rotational speed of 50 to 500 r.p.m.

When a silicon oxide film of 5 to 100 Å thick is formed on the surface of a silicon semiconductor in order to improve a wettability of the silicon surface with respect to the solution, this thin film can prevent the solution from becoming spot condition by the surface tension of liquid. It is also practicable to improve the wettability of semiconductor silicon without a silicon oxide film by adding a surface active agent into the solution.

In these methods, the metal catalyst atoms can be dispersed into semiconductor through the oxide film. In particular, it is possible to promote a crystallization without forming crystal nuclei in the form of grains. Therefore, it is a favorable method.

It is also useful to coat the organic metal uniformly and a UV treatment (ozone treatment) in oxygen is performed for formation of a metal oxide film. In this case, oxidized organic substance can be vaporized and removed as carbon dioxide, so it is possible to make the solid phase growth more uniform.

When the spin coating is carried out only at low rational speed, too much metal constituent for solid phase growth is apt to be supplied into the semiconductor film. Therefore, after the rotation at a low speed, the substance is rotated at 1000 to 10,000 r.p.m., e.g., 2000 to 5000 r.p.m. Thus, an excess organic metal can be eliminated from the surface of substrate and the surface can be dried sufficiently. Moreover, it is effective to control the amount of the organic metal to be formed on the surface. In the above chemical formation method, a continuous layer can be formed on a surface of semiconductor without forming nuclei of metal particles for crystallization.

A metal catalyst layer becomes inhomogeneous layer when it is formed by a physical formation method, on the other hand, it becomes homogeneous layer when it is formed by a chemical method as is the case in the present invention.

In accordance with the above new concept, the crystals can be grown far more uniformly on an entire surface of the semiconductor film when the crystallization is performed by thermal treatment which is performed at 450° C. to 650° C. Therefore, it is possible to form excellent P-I and N-I junctions by using the thus crystallized semiconductor film. In this case, the leak is controlled to be as small as $10^{-12}$ A even if a reverse bias voltage is applied.

In the case of a physical method, 90 to 100 out of 100 P-I junctions have a large leak current, that is $10^{-}$ to $10^{-5}$ A and 50 to 70 out of 100 N-I junctions have $10^{-12}$ to $10^{-6}$ leak current. On the other hand, in the chemical method of the present invention, 5 to 20 out of 100 P-I junctions have a leak current as small as $10^{-13}$ to $10^{-8}$ A and 0 to 20 out of 100 N-I junctions have a leak current as small as $10^{-13}$ to $10^{-8}$ A. So, the present invention improves the characteristics quite remarkably because both an OFF-state current and the probability of a m that leak current is large are reduced.

Besides, the free effect can be obtained in both P-channel TFTs (having a PIP junctions) and N-channel TFTs (having a NIN junctions) by forming the above semiconductor film on an insulating surface. Moreover, the present invention can reduce the probability by about 1 or 2 orders that TFTs having large leak current are formed. However, if the TFTs are used for making thin film IC, the probability which TFTs having large current are formed should be decreased $1/10^3$ to $1/10^9$.

In the present invention, after the thermal crystallization, a laser light having a wavelength 248 nm or 308 nm is irradiated on the surface of the semiconductor with the energy density being at 250 to 400 mJ/cm². The absorption of light is larger in the region that metal constituent exist largely compared to the silicon region crystallized. That is, the region which remains an amorphous structure becomes black optically while the crystal constituent is transparent. Because of this, the slightly remaining amorphous component can be melted by the irradiation of the laser light selectively. Further, the metal existing in the amorphous component can be dispersed to an atomic level in this manner.

As a result, it was possible to reduce the possibility that the metal regions are formed within a recrystallized film, and it was possible to reduce the leak current of a TFT to $10^{-13}$ to $10^{-12}$ A, and further, when $10^4$ to $10^8$ pieces of TFTs were manufactural, only 1–3 of them had an undesirable large leak current. This is because the metal regions which form recombination centers and cause the increase in a leak current are removed from the semiconductor film.

By spin coating in the present method, the leak current of the reversed direction i.e. Ioff is reduced by two orders, and the probability which TFTs having a large leak current exist can be reduced by two orders. Nevertheless, TFTs having a large leak current are formed. Assumably, the cause of forming such defective TFTs is that dust adheres to the surface of the semiconductor, on which organic metal concentrates. The characteristic can be improved by the improvement of experimental equipment.

An experiment was conducted in which laser light was irradiated to a film which was obtained by forming a catalyst metal through a conventional physical formation method and heat crystallizing. In this case, however, an OFF current could not be reduced at all at P-I or N-I junctions when a reverse bias voltage was applied, even if the semiconductor is fused by the irradiation of laser light for recrystallization because metal grains in the starting film tend to be too big.

Accordingly, the method which utilizes a chemical formation method for forming a continuous layer of an organic metal catalyst is entirely different from the conventional method which utilizes a physical formation method followed by a thermal crystallization process. It is clearly understood that the chemical formation method is superior.

Instead of using a solution for forming the continuous catalyst layer, it is possible to utilize a CVD method with an organic metal gas as a starting material. The method is quite effective in order to reduce both an OFF current and the probability which TFTs having a large leak current exist. Further, the process of the present invention is a homogeneous crystal growth, that is, isotropic growth by using metal catalyst. On the other hand, the process of the conventional method is a non-uniform crystal growth, that is, a non-isotropic growth by using metal nuclei.

In the present invention, there are two ways as to how the crystal growth occurs; one is that the crystals are grown in the transverse direction with the surface of the substrate and the other is that the crystals are grown in the vertical direction with the surface of the substrate from the lower side of the semiconductor to the upper side thereof or vice versa. In either case, it was possible to obtain a semiconductor having an excellent electrical characteristics.

What is claimed is:

1. A method for fabricating a semiconductor device, comprising:

forming a mask on a surface of an amorphous silicon film using a resist;

maintaining a compound containing a catalyst element which accelerates crystallization in contact with an exposed portion of the amorphous silicon film;

removing the resist mask; and conducting heat treatment.

2. A method for fabricating a semiconductor device, comprising:

forming a mask on a surface of an amorphous silicon film using a resist;

preparing a solution containing a catalyst element which accelerates crystallization of the amorphous silicon film;

maintaining said solution in contact with an exposed portion of the amorphous silicon film to form a uniform film containing said catalyst element therein on the amorphous silicon film;

removing the resist mask, and then crystallizing said silicon film.

3. A method for fabricating a semiconductor device as claimed in claim 1 or in claim 2, wherein, at least one of the elements selected from Ni, Pd, Pt, Cu, Ag, Au, In, Sn, Pd, Sn, Pd, P, As, and Sb is used as the catalyst element.

4. A method for fabricating a semiconductor device as claimed in claim 1 or in claim 2, wherein, at least one of the elements selected from the elements belonging to the Group VIII, IIIb, IVb, and Vb of the periodic table is used as the catalyst element.

5. A method for fabricating a semiconductor device as claimed in claim 1 or in claim 2, wherein, the semiconductor device fabricated in the active region is a thin film transistor, a diode, or a photo sensor.

6. A method for fabricating a semiconductor device as claimed in claim 1 or in claim 2, wherein, the catalyst element is present in said active layer region in a concentration of from $1 \times 10^{16}$ atoms.cm$^{-3}$ to $1 \times 10^{19}$ atoms.cm$^{-3}$.

7. A method for fabricating a semiconductor device as claimed in claim 1 or in claim 2, wherein, the active region comprises at least one selected from the group consisting of PI, PN, and NI junctions.

8. A method for fabricating a semiconductor device, comprising:

maintaining an amorphous silicon film in contact with a single catalyst element which accelerates crystallization of the amorphous silicon film or a compound containing the catalyst element by holding said pure catalyst element or said compound containing the catalyst element on said amorphous silicon film comprising selectively exposed portions using a resist pattern, while applying heat treatment to the structure to crystallize said amorphous silicon film.

9. A method for fabricating a semiconductor device as claimed in claim 8, wherein, at least one of the elements selected from Ni, Pd, Pt, Cu, Ag, Au, In, Sn, Pd, P, As, and Sb is used as the catalyst element.

10. A method for fabricating a semiconductor device as claimed in claim 8, wherein, at least one of the elements selected from the elements belonging to the Group VIII, IIIb, IVb, and Vb of the periodic table is used as the catalyst element.

11. The method of claim 2 wherein said solution is obtained by dispersing or dissolving a compound of said catalyst element in a solvent.

12. The method of claim 2 wherein said solution further contains a surfactant.

13. The method of claim 2 wherein said solution is obtained by dispersing or dissolving a compound of said catalyst element in a non-polar solvent.

14. A method for fabricating a semiconductor device comprising the steps of:

forming a semiconductor film comprising silicon on an insulating surface;

providing said semiconductor film with a resist mask;

selectively disposing a solution containing a catalyst metal in contact with said semiconductor film in accordance with said resist mask; said catalyst metal being capable of promoting crystallization of said semiconductor film;

removing said resist mask after drying said solution; and then crystallizing said semiconductor film.

15. The method of claim 14 wherein said semiconductor film is amorphous.

16. A method for fabricating a semiconductor device comprising the steps of:

forming a semiconductor film comprising silicon on an insulating surface;

providing said semiconductor film with a resist mask;

selectively disposing a solution containing a catalyst metal in contact with said semiconductor film in accordance with said resist mask, said catalyst metal being capable of promoting crystallization of said semiconductor film;

removing said resist mask after drying said solution; and then crystallizing said semiconductor film, wherein said solution is contacted with said semiconductor film through an oxide layer of said semiconductor film.

* * * * *